United States Patent [19]

Udagawa et al.

[11] Patent Number: 5,237,185
[45] Date of Patent: Aug. 17, 1993

[54] IMAGE PICKUP APPARATUS WITH DIFFERENT GATE THICKNESSES

[75] Inventors: Yoshiro Udagawa, Tokyo; Nobuhiro Takeda, Kawasaki, both of Japan

[73] Assignee: Canon Kabushiki Kaisha, Tokyo, Japan

[21] Appl. No.: 868,968

[22] Filed: Apr. 16, 1992

[51] Int. Cl.$^5$ .............................. H01L 27/14
[52] U.S. Cl. ................... 257/204; 257/291; 257/440; 257/432; 257/448; 358/909
[58] Field of Search ............... 257/440, 432, 294, 448, 257/443, 291, 293, 920, 202, 204, 206, 205, 412, 392, 391; 358/310, 335, 909

[56] References Cited

U.S. PATENT DOCUMENTS

| | | | |
|---|---|---|---|
| 3,894,259 | 7/1975 | Webb | 257/443 X |
| 4,651,227 | 3/1987 | Yunoki et al. | 358/310 |
| 4,688,072 | 8/1987 | Heath et al. | 257/206 X |
| 4,791,396 | 12/1988 | Nishizawa et al. | 257/440 X |
| 4,831,426 | 5/1989 | Kimata et al. | 357/24 |
| 4,835,595 | 5/1989 | Oho et al. | 257/432 X |
| 4,901,129 | 2/1990 | Hynecek | 357/14 |
| 4,996,579 | 2/1991 | Chu | 257/440 |
| 5,038,192 | 8/1991 | Bonneau et al. | 257/206 |
| 5,084,747 | 1/1992 | Miyawaki | 257/432 |

FOREIGN PATENT DOCUMENTS 64-14959 1/1989 Japan.
114956 1/1989 Japan.
1014956 1/1989 Japan.

Primary Examiner—William Mintel
Attorney, Agent, or Firm—Fitzpatrick, Cella, Harper & Scinto

[57] ABSTRACT

An image pickup apparatus comprises color separation means for separating light from a subject into a plurality of colors, and a plurality of image pickup means provided for each of the plurality of colors, each image pickup means having a plurality of pixels, and each pixel having a gate conductor at a light receiving surface. The thickness of the gate conductor of each image pickup means is different for each image pickup means.

8 Claims, 6 Drawing Sheets

IMAGE PICKUP APPARATUS WITH DIFFERENT GATE THICKNESSES

BACKGROUND OF THE INVENTION

Field of the Invention

The present invention relates to an image pickup apparatus, and more particularly to an image pickup apparatus using transistor image sensor elements.

Related Background Art

Various types of image pickup devices have been proposed heretofore. Typical image pickup devices are CCD image pickup devices, MOS type image pickup devices, and the like. With these conventional image pickup devices it is considered that the following problems will occur in the near future in view of the need for high resolution images, typically images of high definition televisions.

The first problem is a reduced aperture efficiency to be caused by the layout of a great number of pixels.

For example, the aperture efficiency of a CCD image pickup device of a half-inch size having four hundred thousand image pickup elements is as low as 30%, increasing the influence of optical shot noises. If the number of pixels (one million three hundred thousand to two million pixels) is to be realized within a one-inch to two-thirds-inch size, the aperture efficiency is expected to become as low as 10 to 20%, posing a serious problem.

The second problem is non-adaptability to speeding up a read operation. In the case of a CCD image pickup device, a low transfer efficiency is feared.

Furthermore, problems of smear and blooming are associated with such conventional image pickup devices. These problems were considered to be difficult to solve.

A new image pickup device, however, has been proposed to solve the above problems, as disclosed in Japanese Patent Laid-Open Application No. 64-14959, entitled "Device for Sensing Threshold Value of Substrate Charge Modulating Type Transistor and Method of Manufacturing Same". The characteristic feature of this image pickup device is that each photosensitive cell is formed by a substrate charge modulating type transistor.

The structure of such an image pickup device will be briefly described with reference to FIGS. 1 and 2. FIG. 1 is a plan view of a photosensitive cell, and FIG. 2 is a cross section taken along line A—A of FIG. 1.

As shown in FIG. 1, each photosensitive cell is constructed of a drain region 18, a gate region 24, and a source region 26. The gate regions 24 are each surrounded by the drain region 18, and disposed in a honeycomb shape. The source region 26 is positioned at the center of the gate region 24. The source regions of adjacent cells are connected to a signal read line 30.

The internal structure as viewed in the depth direction will be described with reference to FIG. 2. The gate region 24 is constructed of a P-type layer 38 and an N-type layer 36 on a buried channel 34 formed on a silicon substrate 11. There are formed an oxide layer 40 for isolating a gate conductor 28 from the gate region 24, and another oxide layer 42 for isolating the gate region 24 from the source conductor 30.

FIG. 3 is a potential diagram of a photosensitive cell. Because of the layered structure of the gate region 24 described above, potential curves 96 and 98 representing a conduction band and a valence band are present. Distances Xd1 and Xd2 represent the thicknesses of two depletion regions. On the potential curves, there are an electron hole potential well 100, a first well 102, and a second well 103. When light (hv) 90 is applied, electron holes generated within the Xd1 region are collected within the electron hole potential well 100. Therefore, the potential distribution changes and a probing current flows from the source to the drain.

The number of electrons accumulated within the well 102 is therefore maintained constant, and so such a state is detected as a change of a threshold value of a MOS transistor. Electron holes accumulated within the well 100 are expelled out to the substrate when a positive pulse is applied to the transistor gate. Since electron holes are accumulated within the well 100 spaced apart from the substrate surface, a reset failure will not occur which has otherwise occurred due to trapping of electron holes at the interface with an oxide. Application of a positive pulse can eliminate such a failure completely. This is advantageous in that reset noises (KTC noises) are hardly generated.

FIG. 4 is an equivalent circuit of an image pickup element. Address data 112 is supplied to a decoder 110 which decodes it and selects an address line 28 to supply a drive pulse to a gate conductor 28 connected to the address line 28. A photosensitive cell is constructed of a drain 18, a gate 24, and a source 26. The source 26 is connected to a bias transistor 118 powered with a bias power source 117. The source 26 is also connected to a read line 120. A signal on the read line 120 is applied via a clamp circuit (constructed of a clamp capacitor Co122, a transistor 126, and pulse source 128) and a sampling circuit (constructed of a transistor 132) to a shift register 46 which outputs a signal via an output amplifier (not shown).

Conventional image pickup devices of the type described above have gate conductors 28 at the aperture areas. Gate conductors are therefore formed using conductive transparent electrodes. It is possible to form them of tin oxide as described in Japanese Patent Laid-Open Application No. 64-14959. However, this technique has problems yet to be solved. Generally speaking, it is therefore preferable to use polysilicon.

SUMMARY OF THE INVENTION

It is an object of the present invention to provide an image pickup apparatus capable of forming a gate conductor using a material such as polysilicon.

According to an embodiment of the present invention, there is provided an image pickup apparatus having a plurality of image pickup elements each having a gate conductor at an aperture area, wherein incident light is separated into a plurality of colors by optical color separation means, and the thickness of a gate conductor of each image pickup element is set such that the peak of the spectral distribution of each color becomes at least nearly equal to the peak of the spectral sensitivity distribution of the image pickup element.

If polysilicon for example is deposited as a gate conductor to a thickness of 3000 to 5000 Å, the spectral transmission factor is greatly influenced, and it is anticipated that the blue color sensitivity particularly near 400 to 500 nm will decrease. In view of this, it is desired on one hand to deposit the polysilicon as thin as possible. On the other hand, the thinner the polysilicon, the more difficult the control of thickness becomes with a low pressure CVD method for example. Thus, there is a tradeoff between a good sensitivity distribution and manufacturing feasibility. A proper gate conductor thickness can be estimated, for example, by calculating the physical properties of polysilicon using a multi-layer interference theory and a computer. With a proper gate conductor thickness, it is possible to provide an image pickup apparatus for a multi-chip camera eliminating the tradeoff between optimum spectral sensitivity for each color and manufacturing feasibility.

According to another embodiment of the present invention, there is provided an image pickup apparatus having a plurality of image pickup elements each having a gate conductor at an aperture area, wherein the thickness of a gate conductor is set such that one of the peaks of the spectral sensitivity becomes equal to the peak of green color sensitivity.

According to this embodiment, the gate conductor thickness is set to the peak of green color sensitivity, which is most closely related to a luminance signal with an improved S/N ratio, thereby to provide an image pickup device having a good spectral sensitivity distribution.

If polysilicon for example is deposited as a gate conductor to a thickness of 3000 to 5000 Å, the spectral transmission factor is greatly influenced, and it is anticipated that the blue color sensitivity particularly near 400 to 500 nm will again decrease. In view of this, it is desired on one hand to deposit the polysilicon as thin as possible. On the other hand, the thinner the polysilicon, the more difficult the control of thickness becomes with a low pressure CVD method for example. Thus, there is a tradeoff between a good sensitivity distribution and manufacturing feasibility. A proper gate conductor thickness can be estimated, for example, by calculating the physical properties of polysilicon using a multi-layer interference theory and a computer. With a proper gate conductor thickness, it is possible to provide an image pickup apparatus eliminating the tradeoff between optimum spectral sensitivity for each color and manufacturing feasibility.

The other objects and advantages of the present invention will become apparent from the following detailed description when read in connection with the accompanying drawings.

DETAILED DESCRIPTION OF THE PREFERRED EMBODIMENTS

Embodiments of the present invention will be described in detail with reference to the accompanying drawings.

In a first embodiment, spectral sensitivities are calculated by estimating the physical properties of polysilicon using a multi-layer interference theory and a computer, and proper gate conductor thicknesses of image pickup elements of a multi-chip camera are obtained.

The structure and operation of an image pickup device to be used in the embodiments are the same as those described with reference to FIGS. 1 to 4, so the description thereof will not be duplicated. The following description is directed to the structure of an image pickup apparatus using such image pickup devices, and a method of calculating a proper gate conductor thicknesses, and the calculated results.

Figure 1:
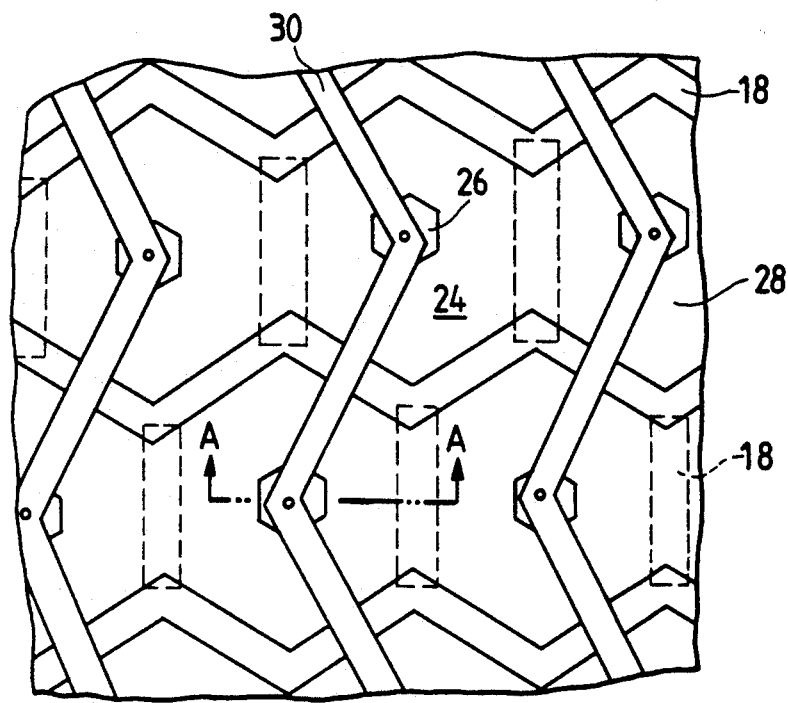
FIG. 1 is a plan view of a substrate charge modulating type photosensitive cell.
Figure 2:
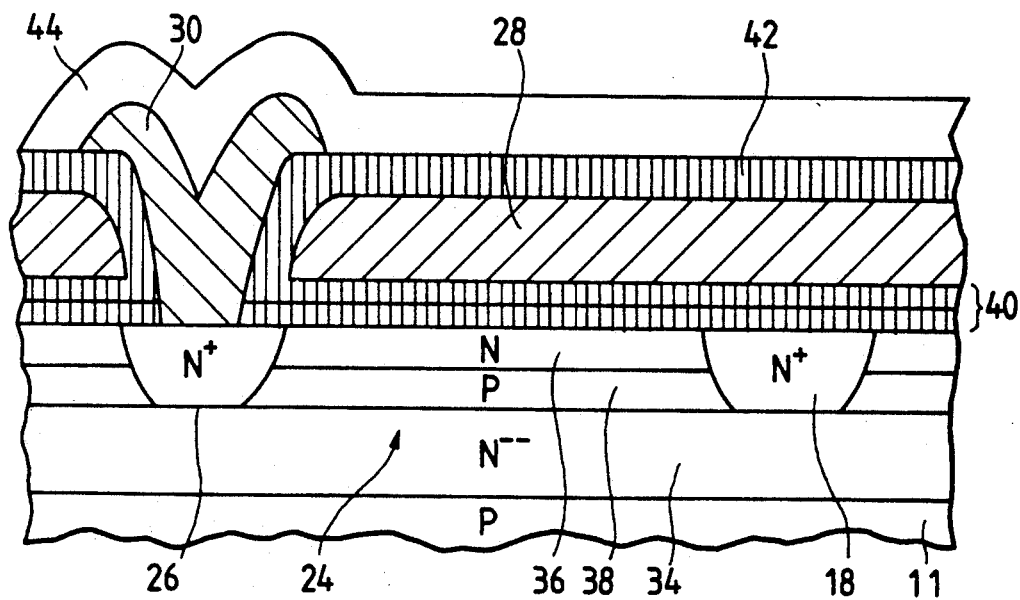
FIG. 2 is a cross section of the substrate charge modulating type photosensitive cell shown in FIG. 1.
Figure 3:
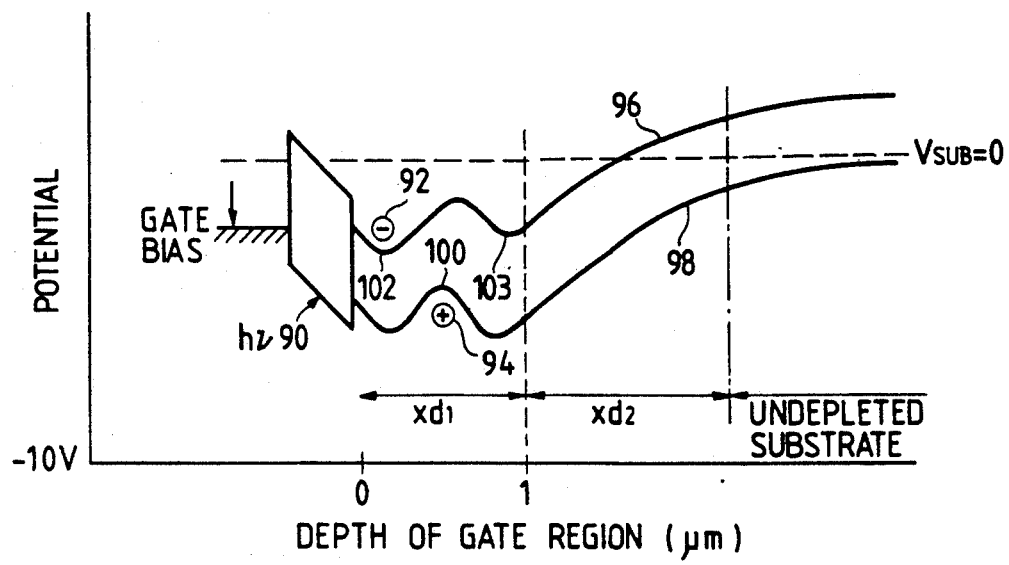
FIG. 3 is a graph showing potential curves of a substrate charge modulating type photosensitive cell.
Figure 4:
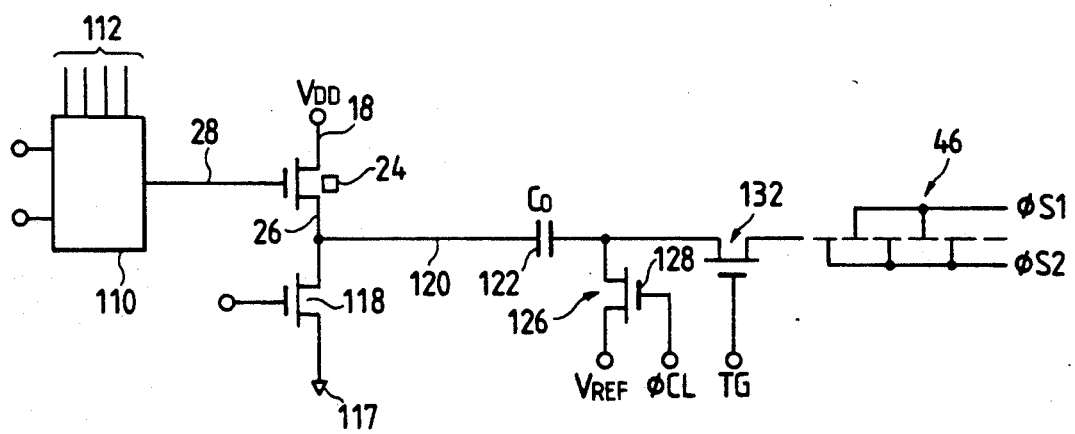
FIG. 4 is an equivalent circuit of a substrate charge modulating type photosensitive cell.
Figure 5:
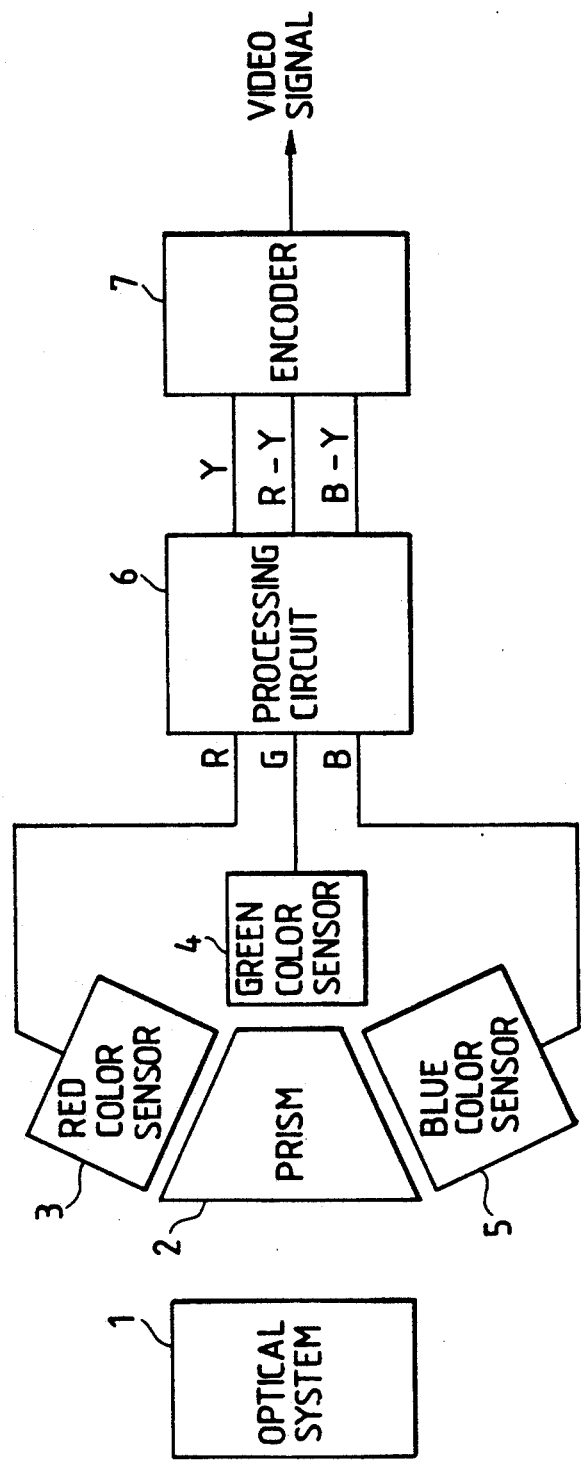
FIG. 5 is a block diagram of a three chip camera according to an embodiment of the present invention.

FIG. 5 is a block diagram showing an embodiment of an image pickup apparatus according to the present invention.

Referring to FIG. 5, an optical image taken by an optical system 1 is separated into three colors R (red), G (green), and B (blue) by using a prism 2 as optical color separation means, and applied to R, G, and B color sensors 3, 4, and 5, respectively, to be photoelectrically converted into electrical signals. The signals are then supplied to a processing circuit 6 and an encoder 7, which outputs video signals. The R, G, and B color sensors each have the same structure as that of the image pickup device described with FIGS. 1 to 4. However, in this embodiment, the thickness of a gate conductor (made of polysilicon) of each of the R, G, and B color sensors is set to a particular value proper to each color R, G, and B, respectively.

Figure 6:
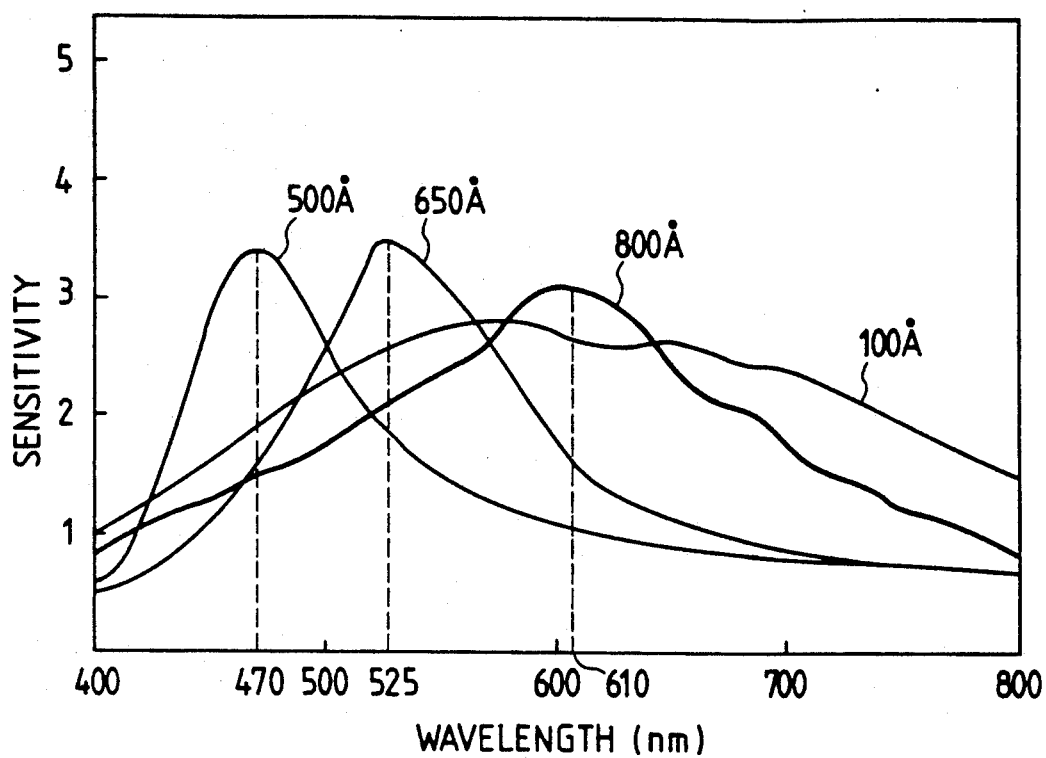
FIG. 6 is a graph showing examples of spectral sensitivities of R, G, and B color sensors.

FIG. 6 is a graph showing spectral sensitivities of image pickup devices each having a respective gate conductor thickness proper to one color from among R, G, and B.

As shown in FIG. 6, the sensitivity of each color can be improved by setting the thicknesses of gate conductors (polysilicon) of blue, green, and red color image pickup devices to 500, 650, and 800 Å, respectively, as compared with the thinnest thickness of polysilicon of 100 Å which is more difficult to control during a manufacturing process than thicknesses such as 500, 650, and 800 Å.

A method of calculating the spectral distribution of an image pickup device will be described below. With the calculated spectral distribution, a proper gate conductor thickness can be obtained.

Figure 7:
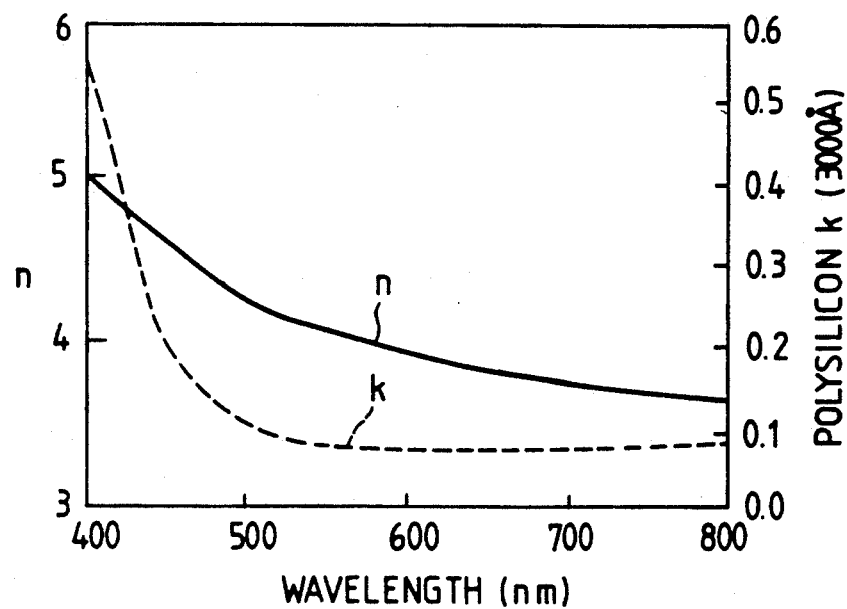
FIG. 7 is a graph showing refraction indices of polysilicon (100 Å)
Figure 8:
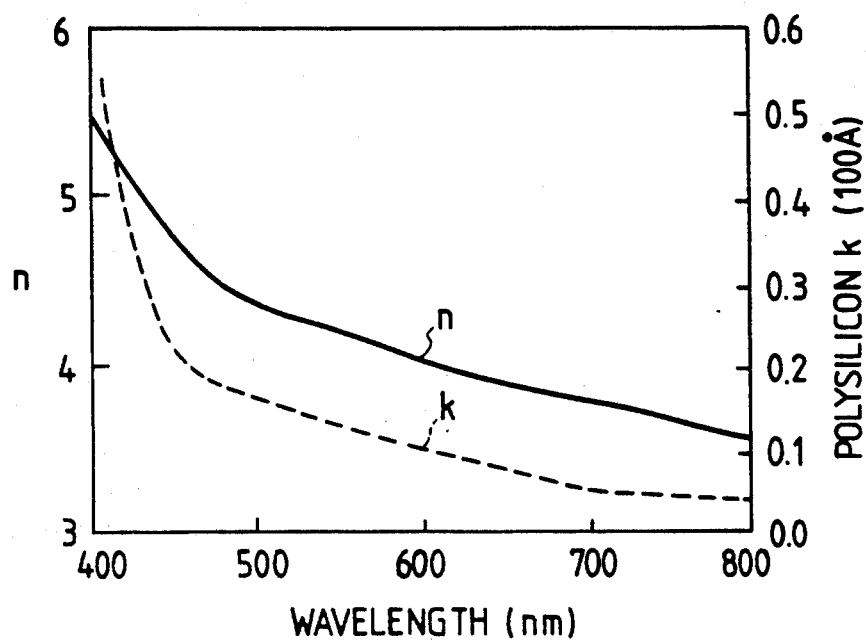
FIG. 8 is a graph showing refraction indices of polysilicon (3000 Å)
Figure 9:
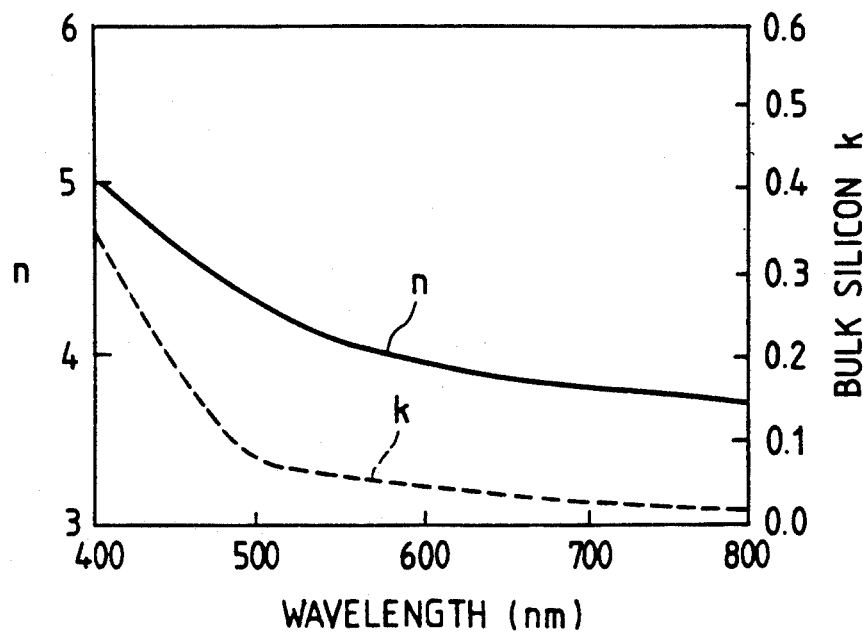
FIG. 9 is a graph showing refraction indices of bulk silicon.

Refraction indices of polysilicon and bulk silicon are shown in FIGS. 7, 8, and 9. A refraction index is represented as a complex refraction index $n-ik$, and an absorption coefficient $\alpha$ is represented by $\alpha = (2\pi/\lambda) \cdot K$. A difference of refraction indices between polysilicon of about 100 Å (FIG. 7) and polysilicon of about 3000 Å (FIG. 8), results from a change of the crystal property of polysilicon. The value of a complex refraction changes with the thickness of polysilicon. In the following calculation, a complex refraction $n-ik$ of an optimal polysilicon thickness is obtained through interpolation between data for polysilicon thickness of about 100 Å and of about 3000 Å.

A light absorption factor $I(x)$ of substance is represented by using an absorption coefficient $\alpha$ by:

$$I(x) = I_0 \cdot \exp(-ax)$$

where $I_0$ represents an intensity of light incident on the surface of substance. Light absorbed in a silicon substrate generates carriers.

The generation rate of light induced carriers at the position X from the substrate surface is given by:

$$g(x) = \frac{(a \cdot I_0 \cdot \lambda)}{hc} \cdot \exp(-a_x) \quad (1)$$

where $I_0$ represents an intensity of incident light, $a$ represents a wavelength, C represents a velocity of light, and h represents Planck's constant.

Consider an image pickup device having the structure described above. Contributing to photocurrent are carriers generated within a space charge region (Xd1 < X < Xd2). A generated photocurrent J is given by:

$$J = q \int_{Xd1}^{Xd2} g(x)dx \quad (2)$$

$$= \frac{qI_0\lambda}{hc}(\exp(-a \cdot Xd2) - \exp(-a \cdot Xd1))$$

Using this equation, the spectral distribution such as is shown in FIG. 6 is calculated using as a parameter the gate conductor thickness.

Semiconductor devices are generally covered with a silicon oxide film or an electrode thin film at the surface thereof. Therefore, light is reflected or absorbed at interfaces between layers and with the substrate, resulting in a loss of incident light amount.

A refraction index at a j-th layer added to a multi-layer (j−1) film is given by:

$$r_{j,o} = \frac{\rho_{j,j-1} + r_{j-1,o} \cdot \exp(i \cdot \gamma_{j-1})}{1 + \rho_{j,j-1} \cdot r_{j-1,o} \cdot \exp(i \cdot \gamma_{j-1})} \quad (3)$$

where the incident angle of the light is assumed to be 0°.

A reflection factor R of light energy is represented by:

$$R = |r_{j,o}|^2 \quad (4)$$

where $$\rho_{j,j-1} = \frac{N_j - N_{j-1}}{N_j + N_{j-1}} \quad (5)$$

$$\gamma_{j-1} = \frac{-4N_{j-1} \cdot d_{j-1}}{\lambda} \quad (6)$$

$$r_{o,o} = 0 \quad (7)$$

where N represents a refraction index which is generally $N = n - iK$.

Accordingly, the energy transmission factor T of a multilayer structure which includes a light absorbing substance is represented by:

$$T = (1-R) \cdot A$$

where A represents an attenuation factor of light in the light absorbing substance.

As a result, a light amount $I_0$ incident to a silicon substrate is given by:

$$I_0 = I \cdot T$$

where I represents a light amount incident on the surface of a photosensitive sensor.

In the above calculation, the following values were used

Xd1 = 0.05 μm
Xd2 = 1.0 μm
silicon oxide film (40 in FIG. 2) = 1000 Å
silicon oxide film (42 in FIG. 2) = 3000 Å
refraction index of silicon oxide film = 1.46

In the above embodiment, photosensitive devices described in Japanese Patent Application Laid-Open No. 64-14959, entitled "Device for Sensing Threshold Value of Substrate Charge Modulating Type Transistor and Method of Manufacturing Same", have been used. Other photosensitive devices having a gate conductor at an aperture area may also be used.

Also, in the above embodiment, a three chip camera has been described for illustrative purpose. Obviously, a two chip camera may also be used. Also, it is not limited to pure colors such as R, G, and B, but complementary colors such as Ye, Cy, Mg, and G may also be used.

According to the above embodiment, it is possible to provide an image pickup apparatus having an optimum spectral distribution for each color, thereby improving the sensitivity and image quality of the apparatus.

Next, another embodiment will be described.

In this embodiment, spectral sensitivities are calculated by estimating the physical properties of polysilicon using a multi-layer interference theory and a computer, and a proper gate conductor thicknesses of image pickup elements of a single chip camera is obtained.

Figure 10:
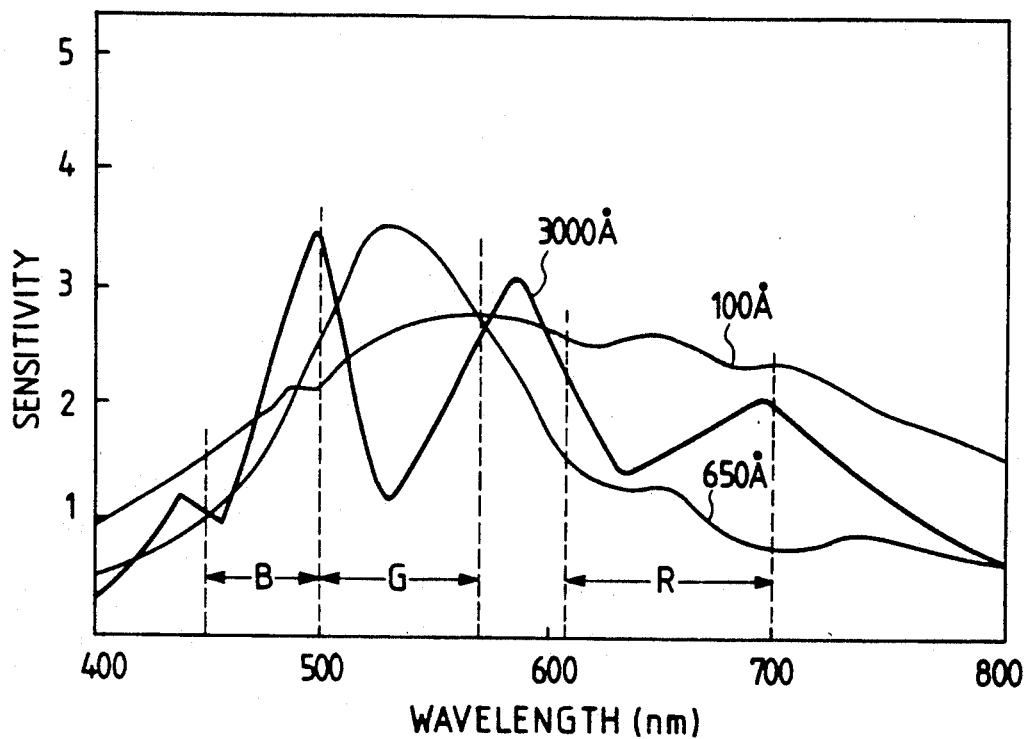
FIG. 10 is a graph showing other examples of spectral sensitivities of R, G, and B color sensors.

FIG. 10 shows a spectral sensitivity curves with thickness of a gate conductor being changed. In this case, wavelength ranges of red (R), green (G) and blue (B) are approximately 610~700 nm, 500~570 nm and 450~500 nm respectively.

As shown in FIG. 10, the sensitivity to green color can be further improved by setting the thickness of the gate conductors (polysilicon) to 650 Å, rather than setting it to the thinnest thickness of 100 Å which is very difficult to control during a manufacturing process. Although the sensitivities to red and blue colors are slightly lowered, the sensitivity to green color is the most closely related to a luminance signal while improving an S/N ratio. The spectral distribution oscillates greatly and has a low sensitivity particularly of green color, when a thickness of 3000 Å of polysilicon is applied.

A sensitivity peak within the visual light range not necessarily is one peak. However, using one peak does not complicate the sensitivity distributions of colors, i.e., will not degrade color reproducibility, when using color filters, and reduces a difference of sensitivities between colors even if the polysilicon thicknesses change more or less during manufacturing.

If the polysilicon thickness is set to 650±100 Å, the sensitivity peak can be set within a wavelength range of green and within a peak wavelength range of human visual sense.

In the second embodiment, calculating the spectral sensitivities is the same as described with respect to the first embodiment.

What is claimed is:

1. An image pickup apparatus comprising:

(a) color separation means for separating light from a subject into a plurality of colors; and (b) a plurality of image pickup means provided for each of said plurality of colors, each said image pickup means having a plurality of pixels, and each said pixel having a gate conductor at a light receiving surface, wherein a thickness of said gate conductor of each said image pickup means is different for each said image pickup means.

2. An image pickup apparatus according to claim 1, wherein said color separation means includes a prism.

3. An image pickup apparatus according to claim 1, wherein said plurality of colors includes red, green, and blue.

4. An image pickup apparatus according to claim 1, wherein said gate conductor is made of polysilicon.

5. An image pickup apparatus according to claim 1, wherein a thickness of said gate conductor of each said image pickup means is set in accordance with the spectral distribution of color for each said image pickup means.

6. An image pickup apparatus comprising:

(a) a color separation filter for separating light from a subject into a plurality of colors including green; and (b) image pickup means having a plurality of pixels each having a gate conductor disposed at a light receiving surface, said image pickup means photoelectrically converting light of each color incident from said color separation filer, wherein a thickness of said gate conductor is set such that the spectral distribution at said thickness corresponds to a peak of a green color sensitivity.

7. An image pickup apparatus according to claim 6, wherein the thickness of said gate conductor is $650 \pm 100$ Å.

8. An image pickup apparatus according to claim 6, wherein said gate conductor is made of polysilicon.

* * * * *

UNITED STATES PATENT AND TRADEMARK OFFICE
CERTIFICATE OF CORRECTION

PATENT NO. : 5,237,185
DATED : August 17, 1993
INVENTOR(S) : YOSHIRO UDAGAWA ET AL.          Page 1 of 2

It is certified that error appears in the above-identified patent and that said Letters Patent is hereby corrected as shown below:

Title page:

Item (30):

Insert, --[30] FOREIGN APPLICATION PRIORITY DATA
           April 19, 1991 [JP] Japan.....3-113723
           April 19, 1991 [JP] Japan.....3-113724--.

Item [56] REFERENCES CITED

Foreign Patent Documents, "114956 1/1989 Japan"
        should be deleted.

COLUMN 2

Line 33, "Co122," should read --Co 122,--.

COLUMN 4

Line 64, "thickness" should read --thicknesses--.

COLUMN 5

Line 45, "$R=|r_{j,o}|'$       (4)" should read
           --$R=|r_{j,o}|^2$       (4)--.
    Line 67, "to" should read --on--.

COLUMN 6

Line 7, "used" should read --used:--.
    Line 33, "and a" should read --and--.
    Line 35, "shows a" should read --shows--.
    Line 49, "of" should read --to--.

UNITED STATES PATENT AND TRADEMARK OFFICE
CERTIFICATE OF CORRECTION

PATENT NO.   : 5,237,185
DATED        : August 17, 1993
INVENTOR(S)  : YOSHIRO UDAGAWA ET AL.          Page 2 of 2

It is certified that error appears in the above-identified patent and that said Letters Patent is hereby corrected as shown below:

COLUMN 7

Line 19, "a" should read --the--.

COLUMN 8

Line 11, "filer," should read --filter,--.

Signed and Sealed this

Seventh Day of June, 1994

Attest:

BRUCE LEHMAN

Attesting Officer     Commissioner of Patents and Trademarks